(12) United States Patent
Nakayama et al.

(10) Patent No.: US 7,998,603 B2
(45) Date of Patent: Aug. 16, 2011

(54) TRANSPARENT CONDUCTIVE FILM, SINTERED BODY TARGET FOR TRANSPARENT CONDUCTIVE FILM FABRICATION, AND TRANSPARENT CONDUCTIVE BASE MATERIAL AND DISPLAY DEVICE USING THE SAME

(75) Inventors: Tokuyuki Nakayama, Ichikawa (JP); Yoshiyuki Abe, Ichikawa (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 127 days.

(21) Appl. No.: 12/579,016

(22) Filed: Oct. 14, 2009

(65) Prior Publication Data

US 2010/0078192 A1    Apr. 1, 2010

Related U.S. Application Data

(63) Continuation of application No. 11/579,978, filed on Nov. 9, 2006, now abandoned.

(30) Foreign Application Priority Data

Jun. 7, 2004 (JP) ................. 2004-168868

(51) Int. Cl.
 *B32B 5/00* (2006.01)
(52) U.S. Cl. ........ 428/699; 428/633; 428/689; 428/697; 428/698; 428/220; 428/701; 428/432; 252/518.1; 252/519.1; 423/624; 204/192.29
(58) Field of Classification Search .......... 428/220, 428/432, 633, 689, 697–699, 701; 252/518.1, 252/519.1; 423/624; 204/192.29
See application file for complete search history.

(56) References Cited

U.S. PATENT DOCUMENTS

| 5,538,767 | A | 7/1996 | Cava et al. |
| 7,476,343 | B2 | 1/2009 | Nakayama et al. |
| 2007/0051926 | A1 | 3/2007 | Nakayama et al. |
| 2007/0184286 | A1 | 8/2007 | Nakayama et al. |
| 2008/0038529 | A1 | 2/2008 | Nakayama et al. |

FOREIGN PATENT DOCUMENTS

| JP | 9-259640 | 10/1997 |
| JP | 2003-335552 | 11/2003 |
| JP | 2004-50643 | 2/2004 |

OTHER PUBLICATIONS

Minami T. "Transparent and conductive multicomponent oxide films prepared by magnetron sputtering". J. Vac. Sci. Technol. A. vol. 17, No. 4 (Jul./Aug. 1999). pp. 1765-1771.

Minami T. "Preparation of highly transparent and conducting Ga2O3-In2O3 films by direct current magnetron sputtering". J. Vac. Sci. Technol. A. vol. 15, No. 3 (May/Jun. 1997). pp. 958-962.

(Continued)

*Primary Examiner* — David R Sample
*Assistant Examiner* — Prashant J Khatri
(74) *Attorney, Agent, or Firm* — Smith, Gambrell & Russell, LLP (57) ABSTRACT

A transparent conductive film which is amorphous, has a high transmittance of light in the visible region of short wavelengths, and is hard to beak with respect to bending is provided. The transparent conductive film is an amorphous oxide film composed of Ga, In, and O, in which a Ga content ranges from 35 at. % to 45 at. % with respect to all metallic atoms, a resistivity ranges $1.2 \times 10^{-3} \Omega \cdot cm$ to $8.0 \times 10^{-3} \Omega \cdot cm$, a film thickness is 500 nm or less, and a transmittance of light at a wavelength of 380 nm is 45% or more.

10 Claims, 3 Drawing Sheets

OTHER PUBLICATIONS

Shannon et al. "Synthesis and Structure of Phases in the In2O3-Ga2O3 System". J. Inorg. Nucl. Chem. vol. 30 (1968). pp. 1389-1398.

Binet et al. "Electron magnetic resonance an optical properties of Ga2-2xIn2xO3 solid solutions". Journal of Physics and Chemistry of Solids, vol. 60, (1999). pp. 1755-1762.

U.S. Appl. No. 12/314,238, Nakayama et al., "Sintered Body Target for . . . Thereon", filed Dec. 5, 2008 (Division of earlier cited U.S. Pat. No. 7,476,343).

Lipin et al., "Protective Properties of Silicon Nitride . . . Sputtering", Society of Vacuum Coasters, 1999, pp. 133-135.

Utsumi et al., "Development of an ITO Target Suitable for Spike-less ITO films for Organic EL Display Use", TOSOH Research & Technology Review, vol. 46 (2002), pp. 11-15.

Partial translation of Utsumi et al.

FIG. 1

| | Sintering temperature | Ga content | Target evaluation | | | Thin film evaluation | | | |
|---|---|---|---|---|---|---|---|---|---|
| | | | Density | Resistivity | (400)/(111) intensity ratio | Film thickness | Transmittance of light | Resistivity | Arithmetic mean height Ra |
| | °C | at. % | g/cm³ | Ω·cm | % | nm | % | Ω·cm | nm |
| Embodiment 1 | 1250 | 40.1 | 5.83 | $3.8 \times 10^{-2}$ | 106.8 | 200 | 61 | $2.8 \times 10^{-3}$ | 0.60 |
| Embodiment 2 | 1350 | 40.1 | 6.48 | $2.9 \times 10^{-2}$ | 82.2 | 200 | 63 | $3.1 \times 10^{-3}$ | 0.51 |
| Embodiment 3 | 1400 | 40.2 | 6.54 | $1.0 \times 10^{-2}$ | 77.4 | 200 | 65 | $3.3 \times 10^{-3}$ | 0.51 |
| Embodiment 4 | 1400 | 40.2 | 6.54 | $1.0 \times 10^{-2}$ | 77.4 | 100 | 75 | $3.5 \times 10^{-3}$ | 0.49 |
| Embodiment 5 | 1400 | 40.2 | 6.54 | $1.0 \times 10^{-2}$ | 77.4 | 500 | 54 | $2.5 \times 10^{-3}$ | 1.22 |
| Embodiment 6 | 1400 | 35.1 | 6.65 | $7.2 \times 10^{-3}$ | 109.3 | 100 | 66 | $1.9 \times 10^{-3}$ | 0.41 |
| Embodiment 7 | 1400 | 35.1 | 6.65 | $7.2 \times 10^{-3}$ | 109.3 | 200 | 60 | $2.2 \times 10^{-3}$ | 0.62 |
| Embodiment 8 | 1400 | 35.1 | 6.65 | $7.2 \times 10^{-3}$ | 109.3 | 500 | 45 | $1.2 \times 10^{-3}$ | 1.54 |
| Embodiment 9 | 1400 | 44.9 | 6.47 | $2.3 \times 10^{-2}$ | 50.2 | 100 | 78 | $8.0 \times 10^{-3}$ | 0.38 |
| Embodiment 10 | 1400 | 44.9 | 6.47 | $2.3 \times 10^{-2}$ | 50.2 | 200 | 71 | $7.4 \times 10^{-3}$ | 0.44 |
| Embodiment 11 | 1400 | 44.9 | 6.47 | $2.3 \times 10^{-2}$ | 50.2 | 500 | 59 | $6.0 \times 10^{-3}$ | 0.81 |
| Comparative example 1 | 1400 | 30.1 | 6.76 | $9.6 \times 10^{-4}$ | 124.7 | 100 | 61 | $9.2 \times 10^{-4}$ | 0.86 |
| Comparative example 2 | 1400 | 30.1 | 6.76 | $9.6 \times 10^{-4}$ | 124.7 | 200 | 53 | $9.1 \times 10^{-4}$ | 0.85 |
| Comparative example 3 | 1400 | 30.1 | 6.76 | $9.6 \times 10^{-4}$ | 124.7 | 500 | 37 | $8.6 \times 10^{-4}$ | 2.12 |
| Comparative example 4 | 1400 | 50.2 | 6.38 | $3.1 \times 10^{-2}$ | 17 | 100 | 85 | $2.3 \times 10^{-2}$ | 0.35 |
| Comparative example 5 | 1400 | 50.2 | 6.38 | $3.1 \times 10^{-2}$ | 17 | 200 | 80 | $2.3 \times 10^{-2}$ | 0.37 |
| Comparative example 6 | 1400 | 50.2 | 6.38 | $3.1 \times 10^{-2}$ | 17 | 500 | 67 | $1.7 \times 10^{-2}$ | 0.67 |
| Comparative example 7 | 1100 | 40.0 | 5.35 | $9.1 \times 10^{-2}$ | * | 200 | 51 | $8.0 \times 10^{-3}$ | 0.72 |
| Comparative example 8 | 1100 | 40.0 | 5.35 | $9.1 \times 10^{-2}$ | * | 500 | 37 | $7.4 \times 10^{-3}$ | 1.32 |
| Comparative example 9 | 1200 | 40.1 | 5.69 | $5.9 \times 10^{-2}$ | 163.9 | 200 | 54 | $6.0 \times 10^{-3}$ | 0.58 |
| Comparative example 10 | 1200 | 40.1 | 5.69 | $5.9 \times 10^{-2}$ | 163.9 | 500 | 40 | $5.8 \times 10^{-3}$ | 1.28 |
| Comparative example 11 | ITO (10 wt.% SnO₂) | | | | | 200 | 48 | $4.6 \times 10^{-4}$ | 2.27 |

\* The β-GaInO₃ phase is not produced and thus the (400)/(111) intensity ratio is not obtained.

|  | Deposition surface | Ga content at. % | Film thickness nm | Silicon oxide-nitride film thickness nm | Resistivity $\Omega \cdot cm$ | Transmittance of light (wavelength 380 nm) % |
|---|---|---|---|---|---|---|
| Embodiment 12 | One | 40 | 200 | 0 | $1.2 \times 10^{-3}$ | 64 |
| Embodiment 13 | Both | 40 | 200 | 0 | $1.2 \times 10^{-3}$ | 60 |
| Embodiment 14 | One | 40 | 200 | 20 | $1.6 \times 10^{-3}$ | 64 |
| Embodiment 15 | Both | 40 | 200 | 20 | $1.6 \times 10^{-3}$ | 60 |

Note) The transmittance of light indicates a measured value containing that of the substrate (PET film, 89 % transmittance of light).

TRANSPARENT CONDUCTIVE FILM, SINTERED BODY TARGET FOR TRANSPARENT CONDUCTIVE FILM FABRICATION, AND TRANSPARENT CONDUCTIVE BASE MATERIAL AND DISPLAY DEVICE USING THE SAME

CROSS REFERENCE TO RELATED APPLICATION

This application is a continuation of Ser. No. 11/579,978, filed Nov. 9, 2006, abandoned, and which is being incorporated in its entirety herein by reference.

TECHNICAL FIELD

This invention relates to a transparent conductive film used in a display device, such as an organic or inorganic EL element, an electronic paper, or a touch panel: a sintered body target for transparent conductive film fabrication; and a transparent conductive base material and a display device using this transparent conductive base material.

BACKGROUND ART

In recent display devices represented by liquid crystal monitors, transparent conductive films are largely used for electrodes. These films need to have a low electrical resistivity and a high transmittance of light in a visible region of wavelengths. As substances satisfying such characteristics in good balance, metal oxide thin films are chiefly used at present, and tin oxide ($SnO_2$) base (which is mainly utilized by doping F or antimony (Sb)) having high chemical stability, indium oxide ($In_2O_3$), and tin-doped indium oxide ($In_2O_3$—$SnO_2$, which is hereinafter referred to as ITO) having excellent electrical and optical properties are known.

However, new display devices, such as organic or inorganic EL elements and electronic papers, have recently been developed and requirements for transparent conductive films have been diversified so that common ITO crystal films can no longer accommodate the requirements.

For example, there is a problem that when the ITO crystal film is used for the organic EL element, the local concentration of electric current is produced because a projection structure due to crystal growth is present, and uniform display becomes difficult. In the visible region, the transmittance of light in a short-wavelength region (the visible region of short wavelengths) of about 380-400 nm is particularly low, and thus there is another problem that the efficiency for taking out the light of a particular wavelength from a light-emitting layer is impaired. From these problems, it is demanded that an amorphous transparent conductive film whose surface is extremely flat or a transparent conductive film having a high transmittance of light in the visible region, notably in the visible region of short wavelengths, should be used for the organic EL element.

As another example, a transparent conductive film that is hard to break with respect to bending is essential for the electronic paper characterized by flexibility. In general, an oxide crystal film has a grain boundary that is slight in structure and is liable to break. Thus, it is known that an amorphous film which is free of the grain boundary is hard to break with respect to bending. From this, it is proposed to use the amorphous transparent conductive film as the transparent conductive film that is resistant to bending. It is needless to say that the high transmittance in the visible region of short wavelengths is important for the amorphous transparent conductive film, like the organic EL element, in order to improve the taking-out efficiency of light.

Patent Reference 1 described below proposes the organic electroluminescence element comprising an organic layer that contains an organic light-emitting layer, sandwiched between an anode and a cathode so that the cathode includes, in order from a side coming in contact with the organic layer, an electron injection electrode layer, a transparent conductive film, and a metallic thin film with a resistivity of $1\times10^{-5}$ Ω·cm or less, laminated one over another and a transparent thin film layer is formed outside the cathode. In this case, an amorphous transparent conductive film using an oxide composed of indium (In), zinc (Zn), and oxygen (O) is applied.

Patent Reference 2 described below sets forth a transparent conductive film in which a compound metallic oxide film containing In, Sn, and Zn, as the transparent conductive film having the properties of the high transmittance of visible light and low resistance, forms at least one kind of $In_4Sn_3O_{12}$ crystal, or microcrystals or amorphism composed of In, Sn, and Zn, and as the composition of metal contained therein, an Sn content indicated by Sn×100/(In=Sn) is 40-60 at. % and a Zn content indicated by Zn×100/(In=Zn) is 10-90 at. %.

Patent Reference 3 described below proposes a transparent conductive film in which, in a quasi-two-dimensional system indicated by an oxide containing magnesium (Mg) and indium (In), MgO—$In_2O_3$, as the transparent conductive film having a band gap of 3.4 eV and a refractive index of light of 2.0 that are almost the same as in a conventional transparent conductive film and possessing much higher conductivity than $MgIn_2O_4$ and $In_2O_3$, namely lower resistivity and excellent optical properties, an In content indicated by In/(Mg=In) is 70-95 at. %.

Patent Reference 4 described below proposes a transparent conductive film in which, in a quasi-two-dimensional system indicated by $Ga_2O_3$—$In_2O_3$ as the transparent conductive film having a composition range considerably different from $GaInO_3$ which has been known in the past and possessing much higher conductivity than $GaInO_3$ and $In_2O_3$, namely lower resistivity and excellent optical properties, a Ga content indicated by Ga/(Ga=In) is 15-49 at. %.

Patent Reference 1: Japanese Patent Kokai No. Hei 10-294182
Patent Reference 2: Japanese Patent Kokai No. Hei 10-83719
Patent Reference 3: Japanese Patent Kokai No. Hei 8-264023
Patent Reference 4: Japanese Patent Kokai No. Hei 9-259640
Patent Reference 5: Japanese Patent Kokai No. Hei 7-182924

However, in each of the above conventional transparent conductive films, the problems still remain that the transmittance of light in the visible region of short wavelengths is low and the taking-out efficiency of light mentioned above is impaired.

Patent Reference 5 states that, in a gallium-indium oxide ($GaInO_3$) film in which a heterovalent dopant like a quadrivalent atom is doped by a small amount, transparency is promoted, index matching is improved, and the electrical conductivity of nearly the same level as in a wide-band-gap semiconductor used at present can be attained. This film is capable of bringing about the high transmittance in the visible region of short wavelengths, but has still the drawbacks that, as in the crystal film mentioned above, the projection structure is produced on the surface of the film and the film is liable to break with respect to bending. Moreover, a substrate temperature as high as about 350° C. is required and thus is disadvantageous to a fabrication process.

Therefore, there is nothing to sufficiently accommodate, in good balance, the demand for the amorphous transparent conductive film whose surface is extremely flat in the organic EL element, the demand for the high transmittance in the visible region, notably in the short-wavelength region (in the visible region of short wavelengths) of about 380-400 nm, and the need for the transparent conductive film that is hard to break with respect to bending in the electronic paper characterized by flexibility. The development of the transparent conductive film combining these properties has been strongly desired.

DISCLOSURE OF THE INVENTION

Problems that the Invention is to Solve

An object of the present invention is to provide a transparent conductive film which is amorphous, has a high transmittance of light in the visible region of short wavelengths, and is hard to break with respect to bending.

Means for Solving Problems

In order to achieve the above object, the transparent conductive film according to the present invention is formed as an amorphous oxide film composed of Ga, In, and O, in which a Ga content ranges from 35 at. % to 45 at. % with respect to all metallic atoms, a resistivity ranges from $1.2 \times 10^{-3} \Omega \cdot cm$ to $8.0 \times 10^{-3} \Omega \cdot cm$, a film thickness is 500 nm or less, and the transmittance of light at a wavelength of 380 nm is 45% or more.

In the transparent conductive film according to the present invention, preferably, the film thickness is 200 nm or less and the transmittance of light at a wavelength of 380 nm is 60% or more.

In the transparent conductive film according to the present invention, preferably, the film thickness is 100 nm or less and the transmittance of light at a wavelength of 380 nm is 65% or more.

In the transparent conductive film according to the present invention, an arithmetic mean height Ra is preferably 2.0 nm or less.

The sintered body target for transparent conductive film fabrication according to the present invention is composed of Ga, In, and O; ranges in Ga content from 35 at. % to 45 at. % with respect to all metallic atoms; is chiefly constructed from a GaInO$_3$ phase of a β-Ga$_2$O$_3$-type structure and an In$_2$O$_3$ phase of a bixbyite-type structure; shows an X-ray diffraction peak intensity ratio defined by the following formula, ranging from 50% to 110%; and has a density of 5.8 g/cm$^3$ or more:

$$In_2O_3 \text{ phase}(400)/\beta\text{-GaInO}_3 \text{ phase}(111) \times 100 [\%]$$

In the sintered body target for transparent conductive film fabrication according to the present invention, the resistivity is preferably $4.0 \times 10^{-2} \Omega \cdot cm$ or less.

In the transparent conductive base material according to the present invention, the transparent conductive film is formed on one or each surface of a transparent substrate of one selected from among materials, such as a glass plate, a quartz plate, a resin plate, and a resin film, by using the sintered body target for transparent conductive film fabrication.

In the transparent conductive base material according to the present invention, a gas barrier film of at least one selected from among compounds, such as silicon nitride, silicon oxide-nitride, and silicon oxide, and the transparent conductive film obtained by using the sintered body target for transparent conductive film fabrication are successively formed on one or each surface of a transparent substrate of one selected from the resin plate and the resin film.

In the display device according to the present invention, the transparent conductive base material is used.

Effect of the Invention

The transparent conductive film according to the present invention is formed as an amorphous oxide film composed of Ga, In, and O, in which the Ga content ranges from 35 at. % to 45 at. % with respect to all metallic atoms, the resistivity ranges $1.2 \times 10^{-3} \Omega \cdot cm$ to $8.0 \times 10^{-3} \Omega \cdot cm$, the film thickness is 500 nm or less, and the transmittance of light at a wavelength of 380 nm is 50% or more. The transparent conductive film has a low resistivity and a high transmittance of light in the visible region of short wavelengths which formerly have never been obtained, and combines dominant features that breakage is hard to occur which is inherent in the amorphous film, the arithmetic mean height is low, and a film surface is smooth. Hence, the transparent conductive film and the display device using such transparent conductive films are useful as versatile display devices.

BEST MODE FOR CARRYING OUT THE INVENTION

Before undertaking the explanation of the embodiments, the progress of the present invention will be described. As the result that the present inventors have studied thoroughly to solve the above problems, they have conducted researches concerning the optical properties of many oxide films formed on the transparent substrate and the ease of fabrication of the amorphous film. Thus, it has become possible to obtain the transparent conductive film which is the amorphous oxide film composed of Ga, In, and O and is hard to break with respect to bending and in which the Ga content ranges from 35 at. % to 45 at. % with respect to all metallic atoms, the resistivity ranges $1.2 \times 10^{-3} \Omega \cdot cm$ to $8.0 \times 10^{-3} \Omega \cdot cm$, the film thickness is 500 nm or less, and the transmittance of light at a wavelength of 380 nm is 45% or more. In this way, the present invention has been completed.

Specifically, a first aspect of the present invention provides the transparent conductive film which is the amorphous oxide film composed of Ga, In, and in which the Ga content ranges from 35 at. % to 45 at. % with respect to all metallic atoms, the resistivity ranges $1.2 \times 10^{-3} \Omega \cdot cm$ to $8.0 \times 10^{-3} \Omega \cdot cm$, the film thickness is 500 nm or less, and the transmittance of light at a wavelength of 380 nm is 45% or more.

A second aspect of the present invention provides the transparent conductive film according to the first aspect of the present invention in which the film thickness is 200 nm or less and the transmittance of light at a wavelength of 380 nm is 60% or more.

A third aspect of the present invention provides the transparent conductive film according to the first aspect of the present invention in which the film thickness is 100 nm or less and the transmittance of light at a wavelength of 380 nm is 65% or more.

A fourth aspect of the present invention provides the transparent conductive film according to any one of the first to third aspects of the present invention in which the arithmetic mean height Ra is 2.0 nm or less.

A fifth aspect of the present invention provides the sintered body target for transparent conductive film fabrication which is composed of Ga, In, and O; ranges in Ga content from 35 at. % to 45 at. % with respect to all metallic atoms; is chiefly constructed from a GaInO$_3$ phase of a β-Ga$_2$O$_3$-type structure and an In$_2$O$_3$ phase of a bixbyite-type structure; shows an X-ray diffraction peak intensity ratio defined by the following formula, ranging from 50% to 110%; and has a density of 5.8 g/cm$^3$ or more:

In$_2$O$_3$ phase(400)/β-GaInO$_3$ phase(111)×100[%]

A sixth aspect of the present invention provides the sintered body target for transparent conductive film fabrication according to the fifth aspect of the present invention in which the resistivity is $4.0 \times 10^{-2}$ Ω·cm or less.

A seventh aspect of the present invention provides the transparent conductive base material which comprises the transparent conductive film according to any one of the first to fourth aspects of the present invention, formed on one or each surface of a transparent substrate of one selected from among materials, such as a glass plate, a quartz plate, a resin plate, and a resin film, by using the sintered body target for transparent conductive film fabrication according to the fifth or sixth aspect of the present invention.

An eighth aspect of the present invention provides the transparent conductive base material which comprises a gas barrier film of at least one selected from among compounds, such as silicon nitride, silicon oxide-nitride, and silicon oxide, and the transparent conductive film according to any one of the first to fourth aspects of the present invention obtained by using the sintered body target for transparent conductive film fabrication according to the fifth or sixth aspect of the present invention, successively formed on one or each surface of a transparent substrate of one selected from the resin plate and the resin film.

A ninth aspect of the present invention provides the display device using the transparent conductive base material according to the seventh or eighth aspect of the present invention.

Subsequently, the embodiments of the present invention will be described, but the present invention is not limited to these embodiments.

The transparent conductive film of the present invention is the amorphous oxide film composed of Ga, In, and O, in which a Ga content ranges from 35 at. % to 45 at. % with respect to all metallic atoms, a resistivity ranges from $1.2 \times 10^{-3}$ Ω·cm to $8.0 \times 10^{-3}$ Ω·cm, a film thickness is 500 nm or less, and the transmittance of light at a wavelength of 380 nm is 45% or more.

The transparent conductive film of the present invention is the amorphous oxide film composed of Ga, In, and O. If the Ga content is below 35 at. %, the transmittance of light in the visible region of short wavelengths will be impaired. Beyond 45 at. %, the conductivity will be lowered.

It is desirable that the resistivity of the transparent conductive film is less than $1.2 \times 10^{-3}$ Ω·cm, but for this, the composition of the transparent conductive film needs a Ga content below 35%. In this case, the problem arises that the transmittance of light at a wavelength of 380 nm is impaired. If the resistivity is beyond $8.0 \times 10^{-3}$ Ω·cm, the range of application of the transparent conductive film will be narrowed to cause a problem.

If the film thickness is 500 nm or less and the transmittance of light at a wavelength of 380 nm is less than 45%, the taking-out efficiency of light, as in a conventional transparent conductive film, will be impaired, and thus it is necessary that the transmittance of light at a wavelength of 380 nm is 45% or more. In particular, it is desirable that in the above transparent conductive film, the film thickness is 200 nm or less and the transmittance of light at a wavelength of 380 nm is 60% or more. It is further desirable that in the above transparent conductive film, the film thickness is 100 nm or less and the transmittance of light at a wavelength of 380 nm is 65% or more.

In the transparent conductive film of the present invention, it is desirable that the arithmetic mean height Ra is 2.0 nm or less. Here, the arithmetic mean height Ra is based on the definition of JIS B0601-2001. The arithmetic mean height Ra more than 2.0 nm is unfavorable for applications in which the flatness of the film surface is required as in the organic EL element.

As techniques of depositing the transparent conductive film of the present invention, a sputtering process, a solution coating method, and a CVD technique are cited as examples. In view of productivity, a magnetron sputtering process using DC plasma (a DC-magnetron sputtering process) is favorable.

When the sputtering process is used to fabricate the transparent conductive film of the present invention, it is important to use the target of the present invention in order to obtain the amorphous transparent conductive film of the present invention that has a high transmittance of light in the visible region of short wavelengths.

The target of the present invention is a sintered body target for thin film fabrication which is composed of Ga, In, and O; ranges in Ga content from 35 at. % to 45 at. % with respect to all metallic atoms; is chiefly constructed from a β-GaInO$_3$ phase and an In$_2$O$_3$ phase; shows an X-ray diffraction peak intensity ratio defined by the following formula, ranging from 50% to 110%; and has a density of 5.8 g/cm$^3$ or more:

In$_2$O$_3$ phase(400)/β-GaInO$_3$ phase(111)×100[%]

Here, the In$_2$O$_3$ phase may be such that oxygen vacancy is introduced and may also be such that Ga is replaced with part of In. The β-GaInO$_3$ phase may be such that a Ga/In ratio of the number of atoms deviates somewhat from a stoichiometric composition and may also be such that oxygen vacancy is introduced.

The sintered body target for thin film fabrication of the present invention, as mentioned above, is the sintered body composed of Ga, In, and O and it is desirable to have the Ga content ranging from 35 at. % to 45 at. % with respect to all metallic atoms. If the Ga content is below 35 at. %, the transmittance of light of a deposited amorphous film in the visible region of short wavelengths will be lowered. On the other hand, beyond 45 at. %, the resistivity of the amorphous film will be increased.

The above description, however, does not apply to the case where a target composition is not virtually equivalent to an amorphous composition on a depositing condition.

Further, in the target of the present invention, it is necessary that a peak intensity ratio between β-GaInO$_3$ phase (111) reflection and In$_2$O$_3$ phase (400) reflection in the X-ray diffraction (a diffraction peak area intensity ratio), defined by the above formula, ranges from 50% to 110%. If the peak intensity ratio is below 50%, the resistivity of the deposited amorphous film will be increased. On the other hand, beyond 110%, the transmittance of light of the amorphous film in the visible region of short wavelengths will be lowered.

According to the JCPDS card (the ASTM card), the main peaks of the β-GaInO$_3$ phase and the In$_2$O$_3$ phase in the X-ray diffraction are governed by (111) reflection and (222) reflection, respectively, but In$_2$O$_3$ phase (222) reflection is superimposed with β-GaInO$_3$ phase (002) reflection, and thus the In$_2$O$_3$ phase is evaluated by (400) reflection that has the second highest intensity.

It is further desirable that the resistivity of the sintered body target for transparent conductive film fabrication is $4.0 \times 10^{-2}$ Ω·cm or less.

In the present invention, by discussing raw material powder, a mixing condition, and a sintering condition described below, the sintered body target for thin film fabrication such as that mentioned above has been obtained. Specifically, when an atmospheric-pressure sintering method is used, it is desirable that the raw material powder has a purity of 3N or more and an average grain diameter is adjusted to 3 μm or less by grinding. It is desirable that compound powder, an organic binder, and a disperser are mixed until a uniform state is reached. In forming, it is desirable to use a hydrostatic press that is capable of applying a uniform stress. It is desirable that the sintering temperature ranges from 1250° C. to 1400° C. and the sintering time is at least 12 hours, and it is more desirable that sintering is performed in a current stream of oxygen. Also, the above conditions are favorable for the case of the atmospheric-pressure sintering method, but they do not apply to the case where a pressure sintering method, such as a hot pressing method, is used.

Embodiment 1 of Patent Reference 3 discloses that a target sintered at 1000° C. is used to form a thin film. When the target is sintered at such a low temperature, however, it is impossible to obtain the target capable of forming the amorphous film of the present invention that exhibits the relatively low resistivity and the high transmittance of light in the visible region of short wavelengths.

In the manufacturing process of the sintered body target for thin film fabrication of the present invention, a (Ga, In)$_2$O$_3$ phase different from the GaInO$_3$ phase and a Ga$_2$O$_3$ phase that is an unavoidable production phase are sometimes produced, depending on the average grain diameter after grinding of the raw material powder and the sintering condition.

The sintered body target of the present invention is chiefly composed of the β-GaInO$_3$ phase and the In$_2$O$_3$ phase, but the (Ga, In)$_2$O$_3$ phase mentioned above may be contained in the target when it is 80% or less at an X-ray diffraction intensity ratio defined by the following formula:

$$\text{Reflection}(2\theta=\text{approximately } 28° \text{ by } (\text{Ga,In})_2\text{O}_3 \text{ phase}/(\text{In}_2\text{O}_3 \text{ phase}(400)+\beta\text{-GaInO}_3 \text{ phase}(111)) \times 100[\%]$$

Here, the description of "reflection (2θ=approximately 28° by (Ga, In)$_2$O$_3$ phase" is due to the fact that, according to the JCPDS card (the ASTM card), the crystal structure and face index of the (Ga, In)$_2$O$_3$ phase are not specified and only the face spacing and an X-ray diffraction relative intensity ratio are specified. Even when the sintered body target for thin film fabrication containing the (Ga, In)$_2$O$_3$ phase in excess of 80% in the above formula is used, a deposited amorphous transparent conductive film exhibits the high transmittance of light in the visible region of short wavelengths. However, the sintered body of a (Ga. In)$_2$O$_3$ single phase shows the resistivity as high as about 5-10 Ω·cm, and thus when the (Ga, In)$_2$O$_3$ phase exceeding 80% in the above formula is contained in the sintered body target for thin film fabrication, a film deposition rate is reduced in the case where the sintered body target is used to perform sputtering and productivity is impaired. It is thus desirable that the content of the (Ga, In)$_2$O$_3$ phase is 80% or less in the formula. Also, unavoidable impurities, such as a Ga$_2$O$_3$ unreactant, may be contained if they are such that the peak in the X-ray diffraction is not observed.

In the sintered body target for thin film fabrication of the present invention, it is desirable that the density of the sintered body is 5.8 g/cm$^3$ or more. Below 5.8 g/cm$^3$, is the frequency of occurrence of abnormal electric discharge in sputtering is increased, and as a result, the amorphous transparent conductive film of good quality cannot be obtained.

In the sintered body target for thin film fabrication of the present invention, it is desirable that the resistivity is $4.0 \times 10^{-2}$ Ω·cm or less. If the resistivity is beyond $4.0 \times 10^{-2}$ Ω·cm, the film deposition rate will be reduced even when DC magnetron sputtering is possible, and therefore, productivity is impaired.

The transparent substrate of one selected from among materials, such as a glass plate, a quartz plate, a resin plate, and a resin film, can be used as the substrate, but the substrate for the display device is not limited to this.

The transparent conductive film of the present invention is a new transparent conductive film which is extremely flat in film surface and amorphous, has the high transmittance of light in the visible region of short wavelengths, particularly at about 380-400 nm, and is hard to break with respect to bending. Hence, it is peculiarly suitable for the resin plate and the resin film.

The transparent conductive base material comprises the transparent conductive film of the present invention formed on one or each surface of a transparent substrate of one selected from among materials, such as a glass plate, a quartz plate, a resin plate, and a resin film, by using the sintered body target for thin film fabrication of the present invention.

When the display device needs a gas barrier property, it is desirable that, in order to impart a gas barrier function to the transparent conductive base plate, at least one layer of the gas barrier film containing at least one selected from among compounds, such as silicon nitride, silicon oxide-nitride, and silicon oxide, is formed on one or each surface of a transparent substrate of one selected from the resin plate and the resin film, between the transparent substrate and the transparent conductive film.

The gas barrier film may contain not only an inorganic film, but also an organic film.

The transparent conductive film of the present invention has the advantage of exhibiting the high transmitting of light in the visible region, notably in the visible region of short wavelengths, and thus if this advantage can be utilized, some application other than that to the transparent electrode is possible. For example, it is possible to apply the transparent conductive film to an antistatic film that may have high electrical resistance, a protection film for optical recording media that may be used as an insulation film, or a simple optical thin film.

The transparent conductive base material of the present invention can be used to construct the display device. The transparent conductive film of the present invention is an amorphous oxide film composed of Ga, In, and O, in which a Ga content ranges from 35 at. % to 45 at. % with respect to all metallic atoms, the resistivity ranges $1.2 \times 10^{-3}$ Ω·cm to $8.0 \times 10^{-3}$ Ω·cm, the film thickness is 500 nm or less, and the transmittance of light at a wavelength of 380 nm is 50% or more. The transparent conductive film has a low resistivity and a high transmittance of light in the visible region of short wavelengths which formerly have never been obtained, and combines dominant features that breakage is hard to occur which is inherent in the amorphous film, the arithmetic mean height Ra is low, and a film surface is smooth. From this, the transparent conductive base material using the transparent conductive film can be used for versatile display devices, such as an organic or inorganic El element, an electronic paper, and a touch panel.

For example, in order to satisfy demands for the amorphous transparent conductive film which is extremely flat in film surface and for the high transmittance of light in the visible region, notably in the short-wavelength region at about 380-400 nm, in the application of the organic EL element, and the need for the transparent conductive film which is hard to break with respect to bending in the application of the electronic paper characterized by flexibility, it is effective to provide the transparent conductive film of the present invention which is extremely flat in film surface and amorphous, has the high transmittance of light in the visible region of short wavelengths, particularly at about 380-400 nm, and is hard to break with respect to bending.

The embodiments of the present invention will be described below, together with the comparative examples.

The resistivity of each of fabricated films is measured by a 4-pin prove technology, using LORESTA-IP, MCP-T250 by Mitsubishi Chemical Corporation. The transmittance of light at a wavelength of 380 nm is measured by using a spectrophotometer (U-4000 by Hitachi, Ltd.). The arithmetic mean height Ra is measured by an atomic force microscope (Nanoscope III by Digital Instruments Co., Ltd.). The crystal structure of each fabricated film is identified from the X-ray diffraction (using a CuK α line, by Rigaku Denki Kogyo Co., Ltd.). The sintered body target and the film composition are studied by an ICP optical emission spectral analysis technique (using SPS4000 by Seiko Instruments Inc.). The density of the sintered body is measured by the Archimedes technique (using a high precision automatic densimeter by Toyo Seiki Seisaku-sho, Ltd.).

Embodiments 1-3

$Ga_2O_3$ powder and $In_2O_3$ powder, each having a purity of 4N, are ground by a ball mill and are adjusted so that an average grain diameter is 3 μm or less. After that, the powder is blended so that the Ga content expressed by Ga/(Ga=In) is 40 at. % and is mixed with an organic binder, a dispersant, and a plasticizer by the ball mill for 48 hours to prepare a slurry. The slurry thus obtained is sprayed and dried by a spray dryer into granulation powder.

Next, the granulation powder obtained is admitted to a rubber mold and a molded body with a diameter of 191 mm and a thickness of nearly 6 mm is fabricated by a hydrostatic press. Molded bodies likewise obtained are sintered under atmospheric pressure for 20 hours at 1250° C., 1350° C., and 1400° C. respectively, in a current stream of oxygen. Machining and grinding operations are performed with respect to the periphery and surface of each of sintered bodies, which is shaped to have a diameter of about 6 inch and a thickness of about 5 mm.

Figure 1:
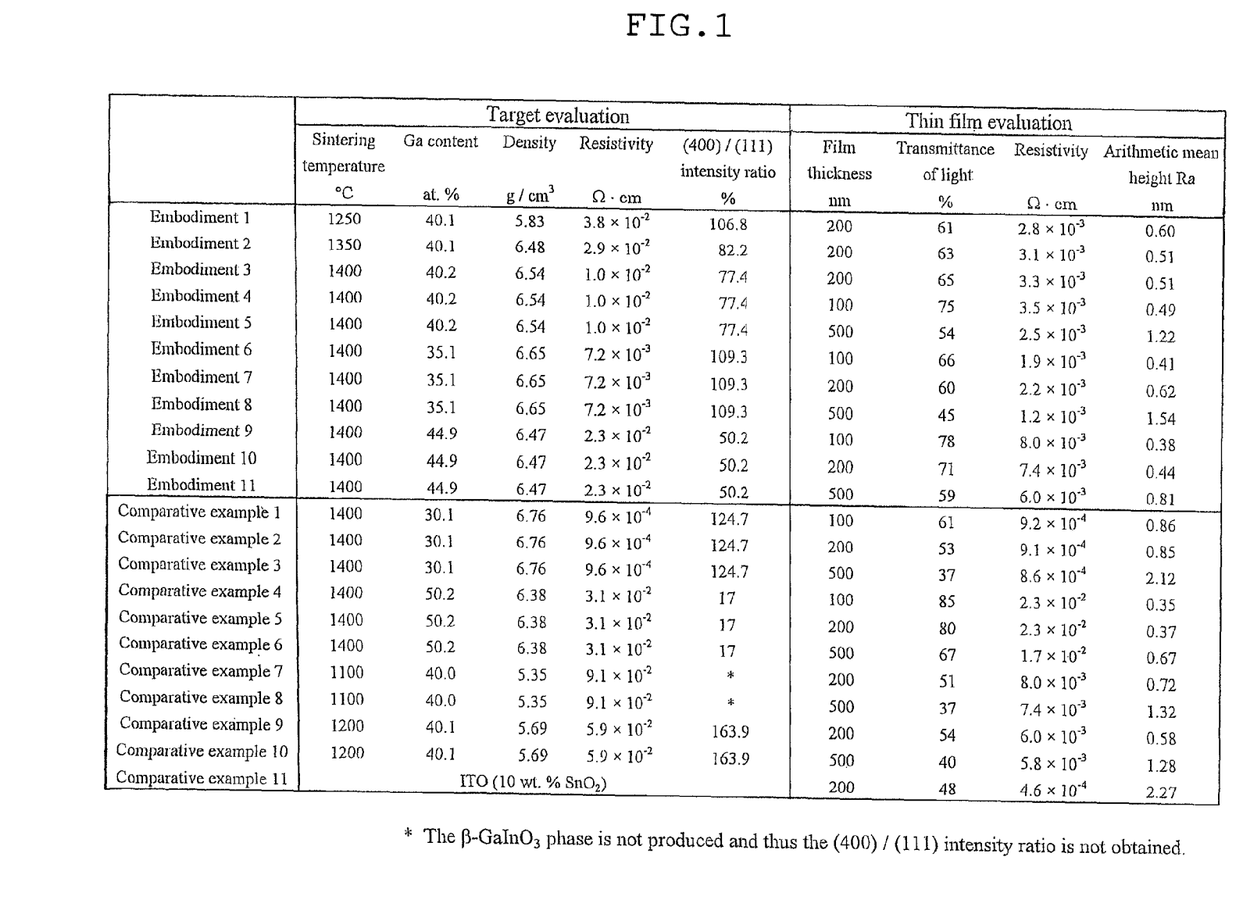
FIG. 1 is a table showing together the target evaluation and thin film evaluation of Embodiments 1-11 and Comparative examples 1-11 in the present invention.
Figure 2:
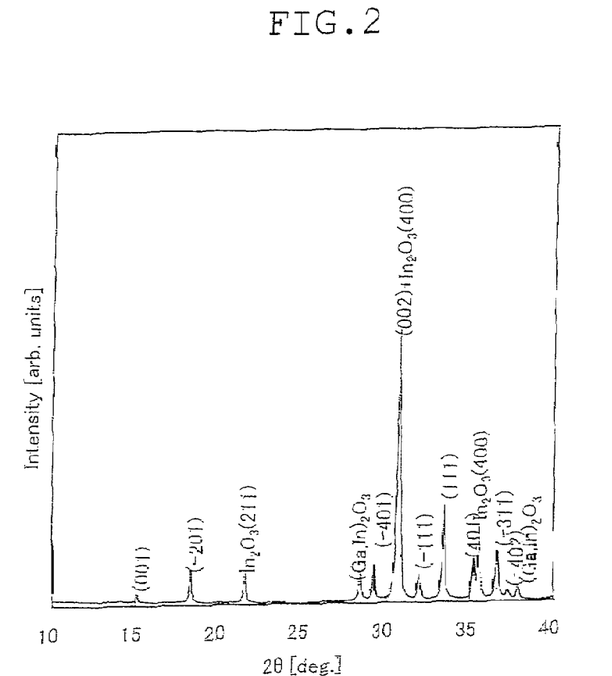
FIG. 2 is a diagram showing an X-ray diffraction pattern of a sintered body obtained at a sintering temperature of 1400° C.

In these sintered bodies, the Ga content, the density, the resistivity, and the $In_2O_3$ phase (400)/β-$GaInO_3$ phase (111) peak intensity ratio obtained by the X-ray diffraction are shown in FIG. 1. FIG. 2 shows the X-ray diffraction pattern of a sintered body obtained at a sintering temperature of 1400° C. For the peak of the β-$GaInO_3$ phase, only the face index is shown.

Next, each sintered body is bonded to a cooled copper plate and is used as the sintered body target for thin film fabrication. As a sputtering device, SPF-530H by ANELVA Corporation is used. The substrate uses 7059 substrate by Corning Inc. and is placed parallel with a target surface. A distance between the substrate and the target is set to 60 mm. A sputtering gas uses a gas mixture including Ar and $O_2$ so that the proportion of oxygen is set to 1.5% and the total gas pressure to 0.5 Pa. The making DC power is set to 200 W. On the above conditions, room temperature deposition is carried out by DC magnetron sputtering. The electric discharge is stable and abnormality, such as occurrence of an arc discharge, is not recognized. The deposition time is controlled and the transparent conductive film with a thickness of 200 nm is obtained.

Figure 3:
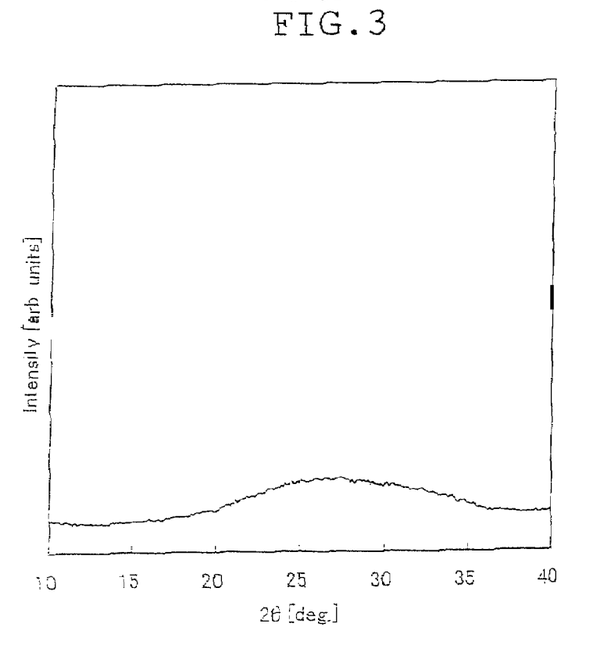
FIG. 3 is an X-ray diffraction diagram of a thin film formed by using a target sintered at 1400° C.

FIG. 3 shows an X-ray diffraction diagram of a thin film deposited by using a target sintered at 1400° C. As seen from this figure, there is no definite peak, and it is confirmed that the film is amorphous. A film deposited with a target at a different sintering temperature is also amorphous.

In the film deposited with each target, the measured results of the transmittance of light at a wavelength of 380 nm, the resistivity, and the arithmetic mean height Ra are shown in FIG. 1. By an ICP analysis, it is confirmed that the film composition and the target composition are nearly equivalent.

Embodiments 4 and 5

The deposition time is controlled so that film thicknesses are 100 nm and 500 nm, and deposition is carried out in the same way as Embodiment 3. The measured results of the transmittance of light at a wavelength of 380 nm, the resistivity, and the arithmetic mean height Ra of each film are shown in FIG. 1. By the ICP analysis, it is confirmed that the to film composition and the target composition are nearly equivalent.

Embodiments 6-11

The Ga content expressed by Ga/(Ga=In) is changed to 35 and 45 at. % and targets are fabricated on the same conditions as Embodiment 3. The time is controlled so that film thicknesses are 100, 200, and 500 nm, and deposition is performed in the same way as Embodiment 3. The measured results of the transmittance of light at a wavelength of 380 nm, the resistivity, and the arithmetic mean height Ra of each film are shown in FIG. 1. By the ICP analysis, it is confirmed that the film composition and the target composition are nearly equivalent.

Embodiments 12-15

A substrate comprising silicon oxide-nitride formed on one surface only or each surface of a PET film with a thickness of 50 μm is provided. The room temperature deposition is performed on the silicon oxide-nitride substrate on the same deposition conditions as Embodiment 3 to fabricate the transparent conductive base material.

Figure 4:
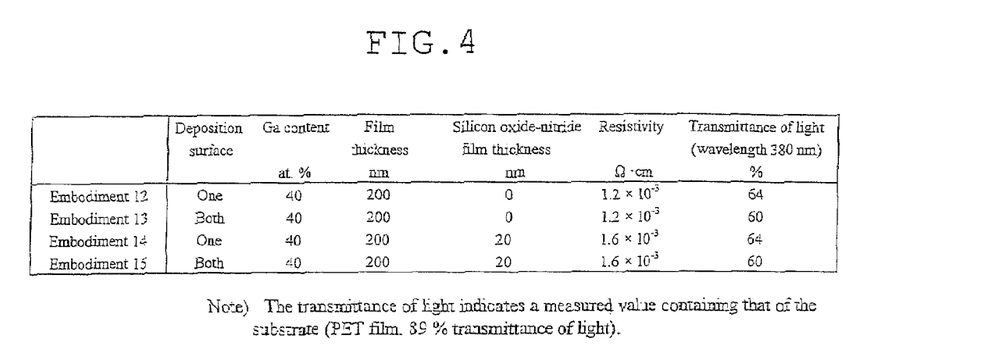
FIG. 4 is a table showing together the film forming surface, Ga content, silicon oxide-nitride film thickness, resistivity, and transmittance of light of Embodiments 12-15 in the present invention.

In FIG. 4, the measured results of the transmittance of light at a wavelength of 380 nm, the resistivity, and the arithmetic mean height Ra of each base material are shown.

Embodiment 16

A PET film with a thickness of 188 μm has a hard coat layer on its one surface, and the room temperature deposition is carried out under the same conditions as Embodiment 3 on a surface opposite to the hard coat layer so that a surface resistivity is 400Ω/□. In this way, the transparent conductive base material is fabricated.

Subsequently, a GaInO film is deposited on a transparent glass substrate at room temperature so that the surface resistivity is 400Ω/□. In this way, the transparent conductive base material is fabricated.

These two kinds of transparent conductive base materials are combined with a display to fabricate a resistance touch panel.

On investigation as to visibility, it is confirmed that the visibility of purple-blue color tone is favorable compared with that where the ITO is used in the transparent conductive film.

Comparative Examples 1-6

The Ga content expressed by Ga/(Ga=In) is changed to 30 and 50 at. % and sintered body targets are fabricated on the same conditions as Embodiment 3. In these sintered bodies, the Ga content, the density, the resistivity, and the $In_2O_3$ phase (400)/β-$GaInO_3$ phase (111) peak intensity ratio obtained by the X-ray diffraction are shown in FIG. 1. Using these targets, the room temperature deposition is performed on the same deposition conditions as Embodiment 3. In this case, the deposition time is controlled so that film thicknesses are 100 nm, 200 nm, and 500 nm.

The transmittance of light at a wavelength of 380 nm, the resistivity, the arithmetic mean height Ra, and the crystal structure identified from the X-ray diffraction are further shown in FIG. 1.

Comparative Examples 7-10

The sintered body targets that are the same as in Embodiment 3 are fabricated by changing the sintering temperatures to 1100° C. and 1200° C. The density and the resistivity of each sintered body are shown in FIG. 1. On a structural analysis with the X-ray diffraction, the β-$GaInO_3$ phase is little produced at a sintering temperature of 1100° C. and only the (Ga, In)$_2O_3$ phase and the $In_2O_3$ phase are produced. Therefore, the $In_2O_3$ phase (400)/β-$GaInO_3$ phase (111) peak intensity ratio cannot be found. Also, it is obvious that the $In_2O_3$ phase (400) peak intensity is higher than in Embodiments 1-3 and a large number of $In_2O_3$ phases are produced. Only the $In_2O_3$ phase (400)/β-$GaInO_3$ phase (111) peak intensity ratio at 1200° C. is further shown in FIG. 1.

Using these sintered body targets, the time is controlled so that film thicknesses are 200 nm and 500 nm, and the room temperature deposition is performed. In deposition with a target at a sintering temperature of 1100° C., the arc discharge is often generated during deposition. Even when a target at a sintering temperature of 1200° C. is used, the arc discharge, although not so often as the case of 1100° C. is considerably generated. Specifically, in targets sintered at 1100° C. and 1200° C., their densities are below 5.8 g/cm³ and thus arcing is often generated during sputter deposition. This causes the problems that the film is damaged and the fluctuation of the deposition rate is heavy. As such, stable deposition cannot be achieved. As a result of the structural analysis with the X-ray diffraction, any film obtained is amorphous. In each film, the transmittance of light at a wavelength of 380 nm, the resistivity, the arithmetic mean height Ra, and the crystal structure identified from the X-ray diffraction are shown in FIG. 1.

Comparative Example 11

The room temperature deposition of the ITO (10 wt. % $SnO_2$) is carried out on the same deposition condition as in Embodiment 1. In this case, the deposition time is controlled so that the film thickness is 200 nm. In FIG. 1, the resistivity, the transmittance of light at a wavelength of 380 nm, the arithmetic mean height Ra, and the crystal structure identified from the X-ray diffraction are shown.

"Evaluation"

From the results of Embodiments 1-11 in FIG. 1, the features of the transparent conductive film of the present invention which is composed of Ga, In, and O and in which the Ga content expressed by Ga/(Ga=In) ranges from 35 at. % to 45 at. % are seen. Specifically, the film is an amorphous film in which the arithmetic mean height Ra is less than 2.0 nm and the surface is extremely flat; has the transmittance of light which is more than 50% for thicknesses less than 500 nm, more than 55% for thicknesses less than 300 nm, and more than 65% for thicknesses less than 100 nm at a wavelength of 380 nm: and possesses the resistivity less than $8.0 \times 10^{-3}$ Ω·cm which is necessary and sufficient for the display device.

Similarly, from the results of Embodiments 1-11, the features of the sintered body target for thin film fabrication of the present invention which is composed of Ga, In, and O and in which the Ga content expressed by Ga/(Ga=In) ranges from 35 at. % to 45 at. % are seen. Specifically, the X-ray diffraction peak intensity ratio defined by the formula described below ranges from 50% to 110%, the density is more than 5.8 g/cm³, and the resistivity is less than $4.0 \times 10^{-2}$ Ω·cm, so that the target has properties necessary and sufficient to obtain the transparent conductive film.

$In_2O_3$ phase(400)/β-$GaInO_3$ phase(111)×100[%]

From Comparative examples 1-6, it is seen that, outside the composition limit of the transparent conductive film and the sintered body target in which the Ga content expressed by Ga/(Ga=In) ranges from 35 at. % to 45 at. %, original features are not exhibited. Specifically, when the Ga content is 30 at. %, the X-ray diffraction peak intensity ratio expressed by the above formula exceeds 110%. In this case, the transmittance of light at a wavelength of 380 nm is below 45% for 500 nm in film thickness, below 60% for 200 nm in film thickness, and below 65% for 100 nm in film thickness. When the Ga content is 50 at. %, the X-ray diffraction peak intensity ratio is less than 50%. Whereby, although the transmittance of light at a wavelength of 380 nm is fairly high, the resistivity becomes higher than $8.0 \times 10^{-2}$ Ω·cm.

From Comparative examples 7-10, it is seen that when the sintering temperature is below 1200° C., the X-ray diffraction peak intensity ratio is beyond 110%. It is further seen that when such targets are used to carry out deposition, the transmittance of light at a wavelength of 380 nm is below 50% for 500 nm in film thickness and below 50% for 200 nm in film thickness.

From Comparative example 11, it is seen that in the ITO film known by exhibiting a low resistivity, the transmittance of light at a wavelength of 380 nm is less than 50% for 200 nm in thickness, which is inferior to that of the transparent conductive film of the present invention.

It is confirmed that, as seen from FIG. 4, even when deposition is performed on the resin film as in Embodiments 12-15, the transparent conductive film of the present invention, like Embodiments 1-11, exhibits the original features and is useful for the transparent conductive base material.

It is confirmed that, from Embodiment 16, in the case where the transparent conductive base material of the present invention is used, the display device that is excellent in visibility can be fabricated in contrast with the case where the transparent conductive base material of the conventional ITO film is used.

INDUSTRIAL APPLICABILITY

The transparent conductive film according to the present invention is formed as an amorphous oxide film composed of Ga, In, and O, in which the Ga content ranges from 35 at. % to 45 at. % with respect to all metallic atoms, the resistivity ranges $1.2 \times 10^{-3}$ Ω·cm to $8.0 \times 10^{-3}$ Ω·cm, the film thickness is 500 nm or less, and the transmittance of light at a wavelength of 380 nm is 50% or more. The transparent conductive film has a low resistivity and a high transmittance of light in the visible region of short wavelengths which formerly have never been obtained, and combines dominant features that breakage is hard to occur which is inherent in the amorphous film, the arithmetic mean height is low, and a film surface is smooth. Hence, the transparent conductive film and the display device using such transparent conductive films are useful as versatile display devices.

The invention claimed is:

1. A transparent conductive film formed as an amorphous oxide film composed of Ga, In, and O, wherein Ga content ranges from 35 at. % to 45 at. % with respect to all metallic atoms thereof, film resistivity ranges from $1.2 \times 10^{-3}$ Ω·cm to $8.0 \times 10^{-3}$ Ω·cm, film thickness is 500 nm or less, and the film has a transmittance of light at a wavelength of 380 nm that is 45% or more, and wherein an arithmetic mean height Ra of the transparent conductive film is 2.0 nm or less.

2. A transparent conductive film according to claim 1, wherein the film thickness is 200 nm or less and the transmittance of light at a wavelength of 380 nm is 60% or more.

3. A transparent conductive film according to claim 1, wherein the film thickness is 100 nm or less and the transmittance of light at a wavelength of 380 nm is 65% or more.

4. A transparent conductive base material comprising of a transparent substrate selected from a glass plate, a quartz plate, a resin plate or a resin film and having on one or each surface thereof a transparent conductive film formed by using a sintered body target for transparent conductive film fabrication,
    wherein the transparent conductive film is formed as an amorphous oxide film composed of Ga, In, and O, wherein Ga content ranges from 35 at. % to 45 at. % with respect to all metallic atoms thereof, film resistivity ranges from $1.2 \times 10^{-3}$ Ω·cm to $8.0 \times 10^{-3}$ Ω·cm, film thickness is 500 nm or less, and the film has a transmittance of light at a wavelength of 380 nm that is 45% or more, and
    wherein the target is composed of Ga, In, and O; ranging in Ga content from 35 at. % to 45 at. % with respect to all metallic atoms; being chiefly constructed from a GaInO₃ phase of a β-Ga₂O₃-type structure and an In₂O₃ phase of a bixbyte-type structure; showing an X-ray diffraction peak intensity ratio defined by the following formula which ranges from 50% to 110%; and having a density of 5.8 g/cm³ or more:

In₂O₃ phase(400)/β-GaInO₃ phase(111)×100 [%].

5. A transparent conductive base material according to claim 4, wherein a resistivity of the target is $4.0 \times 10^{-2}$ Ω·cm or less.

6. A transparent conductive base material according to claim 4, wherein an arithmetic mean height Ra of the transparent conductive film is 2.0 nm or less.

7. A transparent conductive base material comprising of a transparent substrate selected from a resin plate or a resin film and having on one or each surface thereof a gas barrier film selected from silicon nitride, silicon oxide-nitride, or silicon oxide, and a transparent conductive film obtained by using a sintered body target for transparent conductive film fabrication and formed on the gas barrier film,
    wherein the transparent conductive film is formed as an amorphous oxide film composed of Ga, In, and O, wherein Ga content ranges from 35 at. % to 45 at. % with respect to all metallic atoms thereof, film resistivity ranges from $1.2 \times 10^{-3}$ Ω·cm to $8.0 \times 10^{-3}$ Ω·cm, film thickness is 500 nm or less, and the film has a transmittance of light at a wavelength of 380 nm that is 45% or more, and
    wherein the target is composed of Ga, In, and O; ranging in Ga content from 35 at. % to 45 at. % with respect to all metallic atoms; being chiefly constructed from a GaInO₃ phase of a β-Ga₂O₃-type structure and an In₂O₃ phase of a bixbyte-type structure; showing an X-ray diffraction peak intensity ratio defined by the following formula which ranges from 50% to 110%; and having a density of 5.8 g/cm³ or more:

In₂O₃ phase(400)/β-GaInO₃ phase(111)×100 [%].

8. A transparent conductive base material according to claim 7, wherein a resistivity of the target is $4.0 \times 10^{-2}$ Ω·cm or less.

9. A transparent conductive base material according to claim 7, wherein an arithmetic mean height Ra of the transparent conductive film is 2.0 nm or less.

10. A display device using a transparent conductive base material including a transparent conductive film formed on one or each surface of a transparent substrate of one selected from a glass plate, a quartz plate, a resin plate, or a resin film, by using a sintered body target for transparent conductive film fabrication,
    wherein the transparent conductive film is formed as an amorphous oxide film composed of Ga, In, and O, wherein Ga content ranges from 35 at. % to 45 at. % with respect to all metallic atoms thereof, film resistivity ranges from $1.2 \times 10^{-3}$ Ω·cm to $8.0 \times 10^{-3}$ Ω·cm, film thickness is 500 nm or less, and the film has a transmittance of light at a wavelength of 380 nm that is 45% or more, and
    wherein the target is composed of Ga, In, and O; ranging in Ga content from 35 at. % to 45 at. % with respect to all metallic atoms; being chiefly constructed from a GaInO₃ phase of a β-Ga₂O₃-type structure and an In₂O₃ phase of a bixbyte-type structure; showing an X-ray diffraction peak intensity ratio defined by the following formula which ranges from 50% to 110%; and having a density of 5.8 g/cm³ or more:

In₂O₃ phase(400)/β-GaInO₃ phase(111)×100 [%].

* * * * *